(12) United States Patent
Suzuki (10) Patent No.: US 12,289,864 B2
(45) Date of Patent: Apr. 29, 2025

(54) OPTO-ELECTRIC TRANSMISSION COMPOSITE MODULE

(71) Applicant: NITTO DENKO CORPORATION, Osaka (JP)

(72) Inventor: Kazuaki Suzuki, Osaka (JP)

(73) Assignee: NITTO DENKO CORPORATION, Osaka (JP)

(*) Notice: Subject to any disclaimer, the term of this patent is extended or adjusted under 35 U.S.C. 154(b) by 232 days.

(21) Appl. No.: 17/911,610

(22) PCT Filed: Mar. 17, 2021

(86) PCT No.: PCT/JP2021/010881
§ 371 (c)(1),
(2) Date: Sep. 14, 2022

(87) PCT Pub. No.: WO2021/187535
PCT Pub. Date: Sep. 23, 2021

(65) Prior Publication Data
US 2023/0118655 A1    Apr. 20, 2023

(30) Foreign Application Priority Data

Mar. 19, 2020  (JP) .................................. 2020-050086

(51) Int. Cl.
*H05K 7/20* (2006.01)
*G02B 6/42* (2006.01)
*H05K 5/04* (2006.01)

(52) U.S. Cl.
CPC ......... *H05K 7/2039* (2013.01); *G02B 6/4268* (2013.01); *G02B 6/428* (2013.01); *H05K 5/04* (2013.01)

(58) Field of Classification Search
CPC .... H05K 7/2039; G02B 6/4268; G02B 6/428; G02B 6/12; G02B 6/122; G02B 6/42; G02B 6/43; G06F 1/20
See application file for complete search history.

(56) References Cited

U.S. PATENT DOCUMENTS 8,842,952 B2    9/2014  Tanaka et al.
2004/0062491 A1*  4/2004  Sato .................... G02B 6/4266
                                                              385/88

(Continued)

FOREIGN PATENT DOCUMENTS

CN      109031546 A    12/2018
JP      2006-270036 A  10/2006

(Continued)

OTHER PUBLICATIONS

International Preliminary Report on Patentability issued by WIPO on Sep. 20, 2022, in connection with International Patent Application No. PCT/JP2021/010881.

(Continued)

*Primary Examiner* — Stephen S Sul
*Assistant Examiner* — Jeffrey Francis Stoll
(74) *Attorney, Agent, or Firm* — Edwards Neils LLC; Jean C. Edwards, Esq.

(57) ABSTRACT

Provided is an opto-electric transmission composite module capable of efficiently dissipating heat of an opto-electric conversion portion, which includes an opto-electric hybrid board configured to be optically and electrically connected to an opto-electric conversion portion and including an optical waveguide and an electric circuit board in order toward one side in a thickness direction; a printed wiring board electrically connected to the electric circuit board; a heat dissipating layer; and a casing made of metal, the casing accommodating the opto-electric hybrid board, the printed wiring board, and the heat dissipating member, the casing (Continued)

including a first wall are provided. The first wall, the heat dissipating layer, a portion of the printed wiring board, and the opto-electric hybrid board are disposed in order toward one side in the thickness direction. The heat dissipating layer is in contact with the first wall and the printed wiring board.

4 Claims, 6 Drawing Sheets

(56)  References Cited

U.S. PATENT DOCUMENTS

| | | | |
|---|---|---|---|
| 2007/0080458 A1 | 4/2007 | Ogawa et al. | |
| 2007/0190691 A1 | 8/2007 | Humpston et al. | |
| 2008/0182366 A1 | 7/2008 | Ogawa et al. | |
| 2010/0054671 A1 | 3/2010 | Ban et al. | |
| 2010/0209041 A1* | 8/2010 | Matsushima | H05K 1/0274 385/88 |
| 2011/0044369 A1 | 2/2011 | Andry et al. | |
| 2013/0049041 A1 | 2/2013 | Ramer et al. | |
| 2013/0107463 A1* | 5/2013 | Kuroda | H05K 7/2039 361/719 |
| 2013/0264590 A1 | 10/2013 | Oh et al. | |
| 2014/0328561 A1 | 11/2014 | Tanaka et al. | |
| 2015/0331208 A1 | 11/2015 | Moriyama et al. | |
| 2016/0091191 A1 | 3/2016 | Matsuda et al. | |
| 2017/0023751 A1* | 1/2017 | Steijer | G02B 6/4292 |
| 2017/0137706 A1 | 5/2017 | Fujita et al. | |
| 2018/0156972 A1 | 6/2018 | Kainuma et al. | |
| 2018/0194122 A1* | 7/2018 | Kumamoto | H01L 23/42 |
| 2019/0176448 A1 | 6/2019 | Mukohata et al. | |
| 2019/0241786 A1* | 8/2019 | Hamada | B32B 25/02 |
| 2019/0259711 A1* | 8/2019 | Hamaguchi | H01L 23/42 |
| 2020/0150359 A1* | 5/2020 | Konegawa | G02B 6/4251 |

FOREIGN PATENT DOCUMENTS

| | | |
|---|---|---|
| JP | 2007-142477 A | 6/2007 |
| JP | 2009-003253 A | 1/2009 |
| JP | 2013-134347 A | 7/2013 |
| JP | 2013-219357 A | 10/2013 |
| JP | 2014-078552 A | 5/2014 |
| JP | 2015-022129 A | 2/2015 |
| JP | 2015-065293 A | 4/2015 |
| JP | 2016-027613 A | 2/2016 |
| JP | 2018-093007 A | 6/2018 |
| TW | 200739838 A | 10/2007 |
| WO | 2015/008555 A1 | 1/2015 |
| WO | 2018/030430 A1 | 2/2018 |
| WO | WO-2018181693 A1 * | 10/2018 ............. G02B 6/122 |

OTHER PUBLICATIONS

International Search Report issued in PCT/JP2021/010881 on Jun. 8, 2021.
Written Opinion issued in PCT/JP2021/010881 on Jun. 8, 2021.
Office Action, which was issued by the Japanese Patent Office on Jul. 23, 2024, in connection with Japanese Patent Application No. 2022-508415.
Office Action, issued by the Japanese Patent Office on Jan. 7, 2025, in connection wit Japanese Patent Application No. 2022-508415.
Office Action, issued by the Taiwanese Intellectual Property Office on Oct. 7, 2024, in connection with Taiwanese Patent Application No. 110109909.
Office Action, issued by the Taiwanese Intellectual Property Office on Jan. 21, 2025, in connection with Taiwanese Patent Application No. 110109909.

* cited by examiner

OPTO-ELECTRIC TRANSMISSION COMPOSITE MODULE

CROSS-REFERENCE TO RELATED APPLICATIONS

The present application is a 35 U.S.C. 371 National Stage Entry of for PCT/JP2021/010881, filed on Mar. 17, 2021, which claims priority from Japanese Patent Application No. 2020-050086, filed on Mar. 19, 2020, the contents of all of which are herein incorporated by reference in their entirety.

TECHNICAL FIELD

The present invention relates to an opto-electric transmission composite module.

BACKGROUND ART

Conventionally, an optical module including an opto-electric converter, an FPC (printed wiring board), an optical waveguide, a heat dissipating sheet, a printed board, and a casing lower wall in order downwardly has been known (ref: for example, Patent Document 1 below). In the optical module of Patent Document 1, heat generated from the opto-electric converter is released to the casing lower wall mainly through the heat dissipating sheet.

CITATION LIST

Patent Document

Patent Document 1: Japanese Unexamined Patent Publication No. 2015-22129

SUMMARY OF THE INVENTION

Problem to be Solved by the Invention

However, since the opto-electric converter affects its operability by damage due to the heat generated by itself, the optical module is required to have further higher heat dissipation properties. However, in the optical module described in Patent Document 1, there is a disadvantage that the above-described demand cannot be satisfied.

The present invention provides an opto-electric transmission composite module which is capable of efficiently dissipating heat of an opto-electric conversion portion.

Means for Solving the Problem

The present invention (1) includes an opto-electric transmission composite module including an opto-electric hybrid board configured to be optically and electrically connected to an opto-electric conversion portion and including an optical waveguide and an electric circuit board in order toward one side in a thickness direction; a printed wiring board electrically connected to the electric circuit board; a heat dissipating member; and a casing made of metal, the casing accommodating the opto-electric hybrid board, a portion of the printed wiring board, and the heat dissipating member, the casing including a first wall, wherein the first wall, the heat dissipating member, the printed wiring board, and the opto-electric hybrid board are disposed in order toward one side in the thickness direction, and the heat dissipating member is in contact with the first wall and the printed wiring board.

In the opto-electric transmission composite module, since the heat dissipating member is in contact with the first wall and the printed wiring board, it is possible to efficiently release heat which is generated in the opto-electric conversion portion and reaches the heat dissipating member through the opto-electric hybrid board and the printed wiring board to the first wall. Therefore, the opto-electric conversion portion can operate efficiently, and further, it is possible to efficiently release the heat of the opto-electric conversion portion to the casing.

The present invention (2) includes the opto-electric transmission composite module described in (1), wherein the Asker C hardness at 23° C. of the heat dissipating member is 75 or less.

Since the Asker C hardness of the heat dissipating member is 75 or less, the heat dissipating member can be in tight contact with the first wall and the printed wiring board. Therefore, it is possible to further more efficiently release the heat of the opto-electric conversion portion to the casing.

The present invention (3) includes the opto-electric transmission composite module described in (1) or (2), wherein thermal conductivity in the thickness direction of the heat dissipating member is 5 W/m·K or more.

In the opto-electric transmission composite module, since the thermal conductivity of the heat dissipating member is 5 W/m·K or more, it is possible to further more efficiently release the heat generated in the opto-electric conversion portion.

The present invention (4) includes the opto-electric transmission composite module described in any one of (1) to (3) further including an opto-electric conversion portion optically and electrically connected to the opto-electric hybrid board, and a second heat dissipating member in contact with the opto-electric conversion portion, wherein the casing further includes a second wall disposed at the opposite side to the first wall in the thickness direction with respect to the opto-electric conversion portion, and the second heat dissipating member is in contact with the second wall.

Since the opto-electric transmission composite module further includes the second heat dissipating member, and the second heat dissipating member is in contact with the second wall, it is possible to further more efficiently release the heat generated in the opto-electric conversion portion. That is, it is possible to efficiently release the heat of the opto-electric conversion portion to the casing by the two of the heat dissipating member and the second heat dissipating member.

The present invention (5) includes the opto-electric transmission composite module described in any one of (1) to (4), wherein the Asker C hardness at 23° C. of the second heat dissipating member is 55 or less.

In the opto-electric transmission composite module, since the Asker C hardness of the second heat dissipating member is 55 or less, the second heat dissipating member can be flexibly in contact with the opto-electric conversion portion. Therefore, it is possible to suppress damage to the opto-electric conversion portion.

Effect of the Invention

In the opto-electric transmission composite module of the present invention, it is possible to further more efficiently release heat generated in an opto-electric conversion portion.

DESCRIPTION OF EMBODIMENTS

One Embodiment

One embodiment of an opto-electric transmission composite module of the present invention is described with reference to FIG. 1.

An opto-electric transmission composite module 1 has a predetermined thickness, and has a shape extending in a longitudinal direction. The opto-electric transmission composite module 1 converts transmitted light into electricity and transmits it, and also converts the transmitted electricity into light and transmits it. The opto-electric transmission composite module 1 includes a casing 2, a heat dissipating layer 3 as one example of a heat dissipating member, a printed wiring board 4, an opto-electric hybrid board 5, and an opto-electric conversion portion 6.

The casing 2 has a generally flat box shape having a length in a thickness direction shorter than that in a width direction (direction perpendicular to the thickness direction and the longitudinal direction). The casing 2 integrally has at least a first wall 21, a second wall 22, a connecting wall 23, a second connecting wall which is not shown, and both side walls which are not shown.

The first wall 21 has a flat plate shape extending along the longitudinal direction.

The second wall 22 is oppositely disposed at one side in the thickness direction of the first wall 21 at spaced intervals thereto. A shape of the second wall 22 is the same as that of the first wall 21.

The connecting wall 23 connects one end edge in the longitudinal direction of the first wall 21 to one end edge in the longitudinal direction of the second wall 22 in the thickness direction. The connecting wall 23 has a flat plate shape extending in the width direction. A hole 7 through which one end portion of the printed wiring board 4 is inserted is formed in an intermediate portion in the thickness direction of the connecting wall 23. The hole 7 penetrates the connecting wall 23 in the longitudinal direction.

The second connecting wall which is not shown connects the other end edge in the longitudinal direction of the first wall 21 to the other end edge in the longitudinal direction of the second wall 22 in the thickness direction. The second connecting wall extends in the width direction, and its outer shape is the same as that of the connecting wall 23.

Both side walls which are not shown connect one end edge in the width direction of the first wall 21 to one end edge in the width direction of the second wall 22, and also connect the other end edge in the thickness direction of the first wall 21 to the other end edge in the width direction of the second wall 22 in the thickness direction. Furthermore, both side walls which are not shown are continuous to both end edges in the width direction of the connecting wall 23 and both end edges in the width direction of the second connecting wall which are not shown. Each of both side walls extends in the longitudinal direction.

The casing 2 may consist of two members of a first member 91 including the first wall 21, and a portion of the connecting wall 23, the second connecting wall, and both side walls (other-side portion in the thickness direction) and a second member 92 including the second wall 22, and a remaining portion of the second connecting wall and both side walls (one-side portion in the thickness direction).

The casing 2 is made of a metal. That is, a material for the casing 2 is a metal. Examples of the metal include aluminum, copper, silver, zinc, nickel, chromium, titanium, tantalum, platinum, and gold and alloys of these (brass, red copper, stainless steel, etc.). Preferably, alloys are used, more preferably, brass (alloy of copper and zinc) is used.

The heat dissipating layer 3 has a predetermined thickness, and has a shape extending in the longitudinal direction. The heat dissipating layer 3 is accommodated in the casing 2. Specifically, the heat dissipating layer 3 is in contact with one surface in the thickness direction of the first wall 21. Specifically, the heat dissipating layer 3 is in contact with the entire one surface in the thickness direction of the first wall 21. Examples of the heat dissipating layer 3 include heat dissipating sheets, heat dissipating grease, and heat dissipating plates. An example of a material for the heat dissipating sheet includes a filler resin composition in which a filler is dispersed in a resin. Examples of the filler include alumina (aluminum oxide), boron nitride, zinc oxide, aluminum hydroxide, fused silica, magnesium oxide, aluminum nitride, and carbon fiber. Examples of the resin include silicone resins, epoxy resins, acrylic resins, and urethane resins, and preferably, an epoxy resin is used. A curing agent may be added to the epoxy resin. In order to obtain high thermal conductivity, for example, the heat dissipating sheet includes those in which a filler having anisotropy such as boron nitride and carbon fiber is orientated in the thickness direction. In the heat dissipating sheet, for example, the filler may be orientated in the thickness direction with respect to the resin. Also, the resin includes a thermosetting resin and is in a B-stage or C-stage state. Further, the resin may also include a thermoplastic resin. A ratio of the filler and the resin is appropriately adjusted so as to be the Asker C hardness and the thermal conductivity to be described later.

The Asker C hardness of the heat dissipating layer 3 is, for example, 75 or less, preferably 55 or less, more preferably 50 or less, further more preferably 40 or less, and for example, 1 or more. The Asker C hardness of the heat dissipating layer 3 is determined by a C-type Asker rubber hardness meter. When the Asker C hardness of the heat dissipating layer 3 is the above-described upper limit or less, the heat dissipating layer 3 can be in tight contact with the first wall 21 and the printed wiring board 4, and therefore, it is possible to improve heat dissipation properties by the heat dissipating layer 3.

The thermal conductivity in the thickness direction of the heat dissipating layer 3 is, for example, 1 W/m·K or more, preferably 5 W/m·K or more, more preferably 8 W/m·K or more, further more preferably 10 W/m·K or more, and for example, 200 W/m·K or less. The thermal conductivity of the heat dissipating layer 3 is determined by a steady state method in conformity with ASTM-D5470, or a hot disc method in conformity with ISO-22007-2. When the thermal conductivity of the heat dissipating layer 3 is the above-described lower limit or more, it is possible to efficiently release heat generated in the opto-electric conversion portion 6 through the heat dissipating layer 3.

A thickness of the heat dissipating layer 3 is, for example, 100 µm or more, preferably 300 µm or more, and for example, 3000 µm or less, preferably 1000 µm or less.

As the heat dissipating layer 3, a commercially available product can be used.

The printed wiring board 4 has a predetermined thickness, and has a shape extending in the longitudinal direction. A portion other than a protruding end portion 76 to be described later in the printed wiring board 4 (one example of a portion) is accommodated in the casing 2.

Specifically, the printed wiring board 4 has a generally rectangular outer shape when viewed from the top. The printed wiring board 4 is in contact with one surface in the thickness direction of the heat dissipating layer 3. The printed wiring board 4 includes a supporting board 71 and a conductive circuit 72.

The supporting board 71 is parallel to the first wall 21, and has a shape extending in the longitudinal direction. The supporting board 71 includes the protruding end portion 76. The protruding end portion 76 is provided in a one-side end portion in the longitudinal direction of the supporting board 71, and protrudes toward one side in the longitudinal direction from the connecting wall 23. Examples of a material for the supporting board 71 include hard materials such as glass fiber reinforced epoxy resins. The shore A hardness of the supporting board 71 is, for example, 80 or more, furthermore 90 or more, and for example, 200 or less. When the shore A hardness of the supporting board 71 is the above-described lower limit or more, it is possible to reliably support the opto-electric hybrid board 5 and the opto-electric conversion portion 6, while ensuring the strength of the protruding end portion 76. The shore A hardness is measured based on JIS K 6253-3 (2012) using a durometer (spring-type rubber hardness meter).

The conductive circuit 72 is disposed on one surface in the thickness direction of the supporting board 71. The conductive circuit 72 includes a third terminal 73, a fourth terminal 74, and a wiring which is not shown.

The third terminal 73 is accommodated in the casing 2. The third terminal 73 is disposed at the other side in the longitudinal direction of the connecting wall 23 at spaced intervals thereto.

The fourth terminal 74 is disposed on one surface in the thickness direction of the protruding end portion 76.

A wiring which is not shown connects the third terminal 73 to the fourth terminal 74.

An example of a material for the conductive circuit 72 includes a conductor such as copper.

A thickness of the printed wiring board 4 is, for example, 100 µm or more, preferably 500 µm or more, more preferably 1,000 µm or more, and for example, 10,000 µm or less.

The opto-electric hybrid board 5 is accommodated in the casing 2, and is mounted on the printed wiring board 4. The opto-electric hybrid board 5 has a predetermined thickness, and has a flat plate shape extending in the longitudinal direction. Specifically, the opto-electric hybrid board 5 is in contact with one surface in the thickness direction of the printed wiring board 4. The opto-electric hybrid board 5 includes an optical waveguide 51 and an electric circuit board 52 in order toward one side in the thickness direction.

The optical waveguide 51 has a predetermined thickness, and has a shape extending along the longitudinal direction. The optical waveguide 51 is in contact with one surface in the thickness direction of the printed wiring board 4. The optical waveguide 51 includes an under-cladding layer 53, a core layer 54, and an over-cladding layer 55.

The under-cladding layer 53 has the same shape as the optical waveguide 51 when viewed from the top.

The core layer 54 is disposed in a central portion in the width direction of the other surface in the thickness direction of the under-cladding layer 53. A width of the core layer 54 is narrower than that of the under-cladding layer 53 when viewed from the top.

The over-cladding layer 55 is disposed on the other surface in the thickness direction of the under-cladding layer 53 so as to cover the core layer 54. The over-cladding layer 55 has the same shape as the outer shape of the under-cladding layer 53 when viewed from the top. Specifically, the over-cladding layer 55 is disposed on the other surface in the thickness direction and both side surfaces in the width direction of the core layer 54, and both outer-side portions in the width direction of the core layer 54 on the other surface in the thickness direction of the under-cladding layer 53. Further, the over-cladding layer 55 is in contact with one surface in the thickness direction of the printed wiring board 4.

Further, a mirror 16 is formed in one end portion in the longitudinal direction of the core layer 54.

Examples of a material for the optical waveguide 51 include transparent materials such as epoxy resins. A refractive index of the core layer 54 is higher than those of the under-cladding layer 53 and the over-cladding layer 55. A thickness of the optical waveguide 51 is, for example, 20 µm or more, and for example, 200 µm or less.

The electric circuit board 52 has the same shape as that of the opto-electric hybrid board 5 when viewed from the top. That is, the electric circuit board 52 has a predetermined thickness, and has a flat plate shape extending in the longitudinal direction. It is disposed on one side in the thickness direction of the optical waveguide 51.

The electric circuit board 52 includes a metal supporting layer 56, a base insulating layer 57, a conductive layer 58, and a cover insulating layer which is not shown.

The metal supporting layer 56 has the same outer shape as that of the opto-electric hybrid board 5 when viewed from the top. The optical waveguide 51 is the most other-side portion in the thickness direction of the opto-electric hybrid board 5. Therefore, the metal supporting layer 56 is in contact with the under-cladding layer 53. Examples of a material for the metal supporting layer 56 include metals such as stainless steel. A thickness of the metal supporting layer 56 is, for example, 3 µm or more, and for example, 100 µm or less. The metal supporting layer 56 includes a through hole 8 penetrating in the thickness direction. The through hole 8 is overlapped with the mirror 16 when projected in the thickness direction.

The base insulating layer 57 has the same outer shape as that of the metal supporting layer 56 when viewed from the top. The base insulating layer 57 is disposed on one surface in the thickness direction of the metal supporting layer 56. Specifically, the base insulating layer 57 is in contact with the entire one surface in the thickness direction of the metal supporting layer 56. Further, the base insulating layer 57 closes one end edge in the thickness direction of the through hole 8. Examples of a material for the base insulating layer 57 include resins such as polyimide. A thickness of the base insulating layer 57 is, for example, 5 µm or more, and for example, 40 µm or less.

The conductive layer 58 is disposed on one surface in the thickness direction of the base insulating layer 57. The conductive layer 58 includes a first terminal 27, a second terminal 28, and a wiring which is not shown.

The first terminal 27 is disposed corresponding to the opto-electric conversion portion 6 to be described next. The plurality of first terminals 27 are disposed at spaced intervals from each other.

The second terminal 28 is disposed at one side in the longitudinal direction of the first terminal 27 at spaced intervals thereto. The second terminal 28 is electrically connected to the third terminal 73 via a wiring 65.

The wiring which is not shown connects the first terminal 27 to the second terminal 28.

Examples of a material for the conductive layer 58 include conductors such as copper. A thickness of the conductive layer 58 is, for example, 3 μm or more, and for example, 20 μm or less.

The cover insulating layer which is not shown covers the wiring which is not shown. It is disposed on one surface in the thickness direction of the base insulating layer 57. A material and a thickness of the cover insulating layer are the same as those of the base insulating layer 57.

A thickness of the opto-electric hybrid board 5 is, for example, 20 μm or more, and for example, 200 μm or less.

The opto-electric conversion portion 6 is accommodated in the casing 2, and is mounted on the opto-electric hybrid board 5. The opto-electric conversion portion 6 is oppositely disposed at one side in the thickness direction of the first terminal 27. The opto-electric conversion portion 6 includes a light receiving and emitting member 61 and a bump 62.

The light receiving and emitting member 61 has a generally rectangular flat plate shape extending in the longitudinal direction and the width direction. The light receiving and emitting member 61 includes a light receiving and emitting port 63. The plurality of (for example, four) light receiving and emitting ports 63 are provided on the other surface in the thickness direction of the light receiving and emitting member 61 at spaced intervals from each other. The light receiving and emitting port 63 is overlapped with the through hole 8 when projected in the thickness direction. Thus, the optical waveguide 51 of the opto-electric hybrid board 5 is optically connected to the opto-electric conversion portion 6. When projected in the thickness direction, the light receiving and emitting member 61 is not overlapped with the second terminal 28, and is displaced toward the other side in the longitudinal direction. Examples of the light receiving and emitting member 61 include light emitting elements for converting electricity into light, and specific examples thereof include surface emitting-type light emitting diodes (VECSEL). Examples of the light receiving and emitting member 61 include light receiving elements for converting light into electricity, and specific examples thereof include photodiodes (PD). These may be used alone or in combination of two or more. In the light receiving and emitting member 61, a light emitting driving element (specifically, Driver IC) may be provided in the vicinity of the light emitting element, and a light receiving driving element (specifically, TIA) may be provided in the vicinity of the light receiving element.

The bump 62 is provided so as to protrude from the other surface in the thickness direction of the light receiving and emitting member 61 toward the other side in the thickness direction. The bump 62 is located around the light receiving and emitting port 63. A length (length in the thickness direction, thickness) of the bump 62 is, for example, 1 μm or more, and for example, 100 μm or less. Examples of a material for the bump 62 include conductors such as copper, gold, and solder. The bump 62 is in contact with the first terminal 27. Thus, the light receiving and emitting member 61 of the opto-electric conversion portion 6 is electrically connected to the electric circuit board 52 of the opto-electric hybrid board 5.

Furthermore, the light receiving and emitting member 61, the bump 62, and a mounting portion of the opto-electric hybrid board 5 are reinforced by fixing of an adhesive.

In the opto-electric transmission composite module 1, the first wall 21, the heat dissipating layer 3, the printed wiring board 4, the opto-electric hybrid board 5, and the opto-electric conversion portion 6 are disposed in order toward one side in the thickness direction.

Next, a method for producing the opto-electric transmission composite module 1 is described.

First, the heat dissipating layer 3 is disposed in the first wall 21 of the casing 2.

Subsequently, the heat dissipating layer 3 is disposed on one surface in the thickness direction of the first wall 21. Specifically, the heat dissipating layer 3 is attached to one surface in the thickness direction of the first wall 21. When the casing 2 consists of two members (the first member 91 and the second member 92), one end surface in the longitudinal direction of the heat dissipating layer 3 is brought into contact with the connecting wall 23 and inner-side surfaces of both side walls in the first member 91.

Next, the printed wiring board 4 is disposed on one surface in the thickness direction of the heat dissipating layer 3. Specifically, when the first wall 21 is included in the first member 91, the printed wiring board 4 is provided with respect to the casing 2 (the first member 91) and the heat dissipating layer 3 so that a portion other than the protruding end portion 76 in the supporting board 71 is attached to the heat dissipating layer 3, and the protruding end portion 76 protrudes from the connecting wall 23.

Separately, the opto-electric hybrid board 5 and the opto-electric conversion portion 6 are prepared.

To prepare the opto-electric hybrid board 5, an optical waveguide 51 is provided in an electric circuit board 52 by a known method. Further, the bump 62 is disposed on the first terminal 27, and subsequently, the light receiving and emitting member 61 is connected to the bump 62, so that the opto-electric conversion portion 6 is mounted on the opto-electric hybrid board 5. Thus, the opto-electric hybrid board 5 mounted with the opto-electric conversion portion 6 is prepared.

Subsequently, the opto-electric hybrid board 5 mounted with the opto-electric conversion portion 6 is mounted on the printed wiring board 4. Specifically, the second terminal 28 is connected to the third terminal 73 via the wiring 65, while the optical waveguide 51 is fixed (bonded via an adhesive which is not shown) to the printed wiring board 4.

Thereafter, the second member 92 including the second wall 22 is disposed in the first member 91. Specifically, the connecting wall 23, a second connecting wall which is not shown, and both side walls which are not shown of the second member are connected to the connecting wall 23, a second connecting wall which is not shown, and both side walls which are not shown of the first member 91, respectively. Thus, the casing 2 is fabricated.

Thus, the opto-electric transmission composite module 1 including the casing 2, the heat dissipating layer 3, the printed wiring board 4, the opto-electric hybrid board 5, and the opto-electric conversion portion 6 is produced.

Function and Effect of One Embodiment

Then, in the opto-electric transmission composite module 1, since the heat dissipating layer 3 is in contact with the first wall 21 and the printed wiring board 4, it is possible to efficiently release the heat which is generated in the opto-electric conversion portion 6 and reaches the heat dissipating layer 3 through the opto-electric hybrid board 5 and the printed wiring board 4 to the first wall 21. Therefore, the opto-electric conversion portion 6 can operate efficiently, and further, it is possible to efficiently release the heat of the opto-electric conversion portion 6 to the casing 2.

Since the material for the heat dissipating layer 3 is, as described above, a filler resin composition containing a resin, and the heat dissipating layer 3 has appropriate softness, the heat dissipating layer 3 can be flexibly in contact with both the first wall 21 and the printed wiring board 4. Specifically, when the Asker C hardness of the heat dissipating layer 3 is as low as 75 or less, the heat dissipating layer 3 can be reliably in tight contact with the first wall 21 and the printed wiring board 4, and therefore, it is possible to improve the heat dissipation properties.

On the other hand, in the optical module described in Patent Document 1, even when the heat dissipating sheet is flexible, since the heat dissipating sheet is in contact with the printed board and the optical waveguide, and is not in contact with the casing, it is impossible to achieve the above-described excellent effect.

Further, in the opto-electric transmission composite module 1, when the thermal conductivity of the heat dissipating layer 3 is 5 W/m·K or more, it is possible to further more efficiently release the heat generated in the opto-electric conversion portion 6.

MODIFIED EXAMPLES

In each modified example below, the same reference numerals are provided for members and steps corresponding to each of those in the above-described one embodiment, and their detailed description is omitted. Further, one embodiment and each modified example can be appropriately used in combination. Furthermore, each modified example can achieve the same function and effect as that of one embodiment unless otherwise specified.

Figure 2:
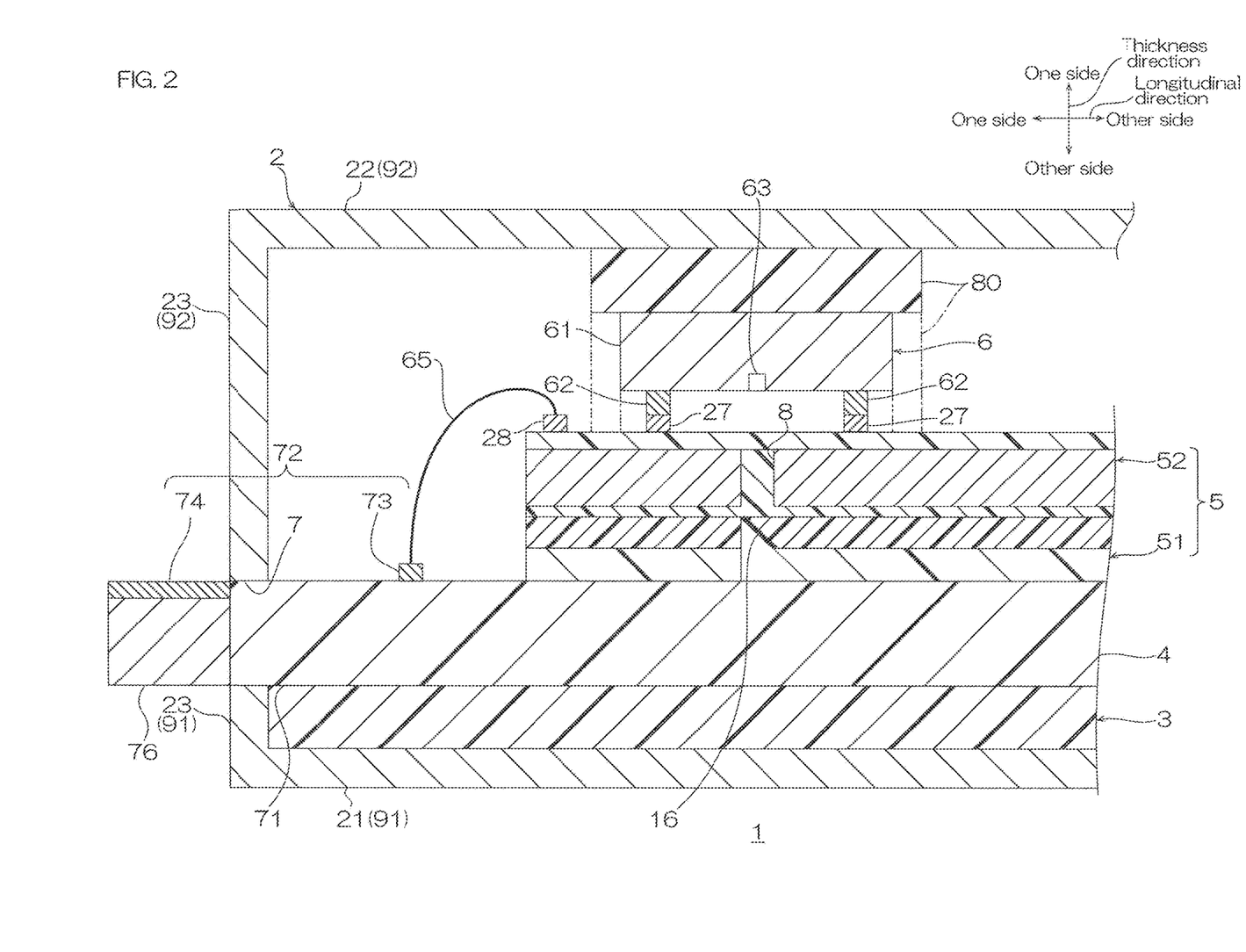
FIG. 2 shows a cross-sectional view of a modified example of the opto-electric transmission composite module shown in FIG. 1.

The opto-electric transmission composite module 1 shown in FIG. 2 further includes a second heat dissipating layer 80 as one example of a second heat dissipating member.

The second heat dissipating layer 80 is interposed between the opto-electric conversion portion 6 and the second wall 22, and is in contact with them. Further, the second heat dissipating layer 80 is in contact with at least one surface in the thickness direction of the light receiving and emitting member 61. As shown by a phantom line of FIG. 2, furthermore, the second heat dissipating layer 80 may be in contact with a peripheral side surface (both surfaces in the longitudinal direction and both surfaces in the width direction) of the light receiving and emitting member 61. In this case, the second heat dissipating layer 80 is also in contact with one surface in the thickness direction of the electric circuit board 52 around the opto-electric conversion portion 6.

Properties of the second heat dissipating layer 80 are the same as those of the heat dissipating layer 3. In particular, when the Asker C hardness of the second heat dissipating layer 80 is the above-described upper limit or less (preferably, 50 or less), the second heat dissipating layer 80 can be flexibly in contact with the light receiving and emitting member 61 of the opto-electric conversion portion 6. It is possible to suppress damage to the opto-electric conversion portion 6 due to the contact with the second heat dissipating layer 80.

In particular, when the second wall 22 is pressed against the second heat dissipating layer 80 at the time of the connection of the first member 91 to the second member 92, the second heat dissipating layer 80 is likely to damage the opto-electric conversion portion 6.

However, in the modified example, since the above-described second heat dissipating layer 80 has the above-described low Asker C hardness (for example, 55 or less), it is possible to efficiently suppress the damage to the opto-electric conversion portion 6.

To provide the second heat dissipating layer 80 in the opto-electric transmission composite module 1, for example, the heat dissipating layer 3 is disposed in the first wall 21, the printed wiring board 4 is disposed in the heat dissipating layer 3, the opto-electric hybrid board 5 mounted with the opto-electric conversion portion 6 is disposed in the printed wiring board 4, and thereafter, the second heat dissipating layer 80 is disposed in the opto-electric conversion portion 6. The second heat dissipating layer 80 is formed into a sheet shape from the same material as that for the heat dissipating layer 3.

Thereafter, the second member 92 including the second wall 22 is connected to the first member 91. At this time, for example, the second wall 22 pushes the second heat dissipating layer 80 in a B-stage state toward the other side in the thickness direction. Then, the second heat dissipating layer 80, while deformed, is brought into contact with the peripheral side surface of the light receiving and emitting member 61, and one surface in the thickness direction of the opto-electric hybrid board 5 around the light receiving and emitting member 61.

Thus, the opto-electric transmission composite module 1 including the casing 2, the heat dissipating layer 3, the printed wiring board 4, the opto-electric hybrid board 5, the opto-electric conversion portion 6, and the second heat dissipating layer 80 is obtained.

Since the opto-electric transmission composite module 1 further includes the second heat dissipating layer 80, and the second heat dissipating layer 80 is in contact with the second wall 22, it is possible to further more efficiently release the heat generated in the opto-electric conversion portion 6. That is, it is possible to efficiently release the heat of the opto-electric conversion portion 6 to the casing 2 by the two of the heat dissipating layer 3 and the second heat dissipating layer 80.

In the opto-electric transmission composite module 1, when the Asker C hardness of the second heat dissipating layer 80 is as low as 55 or less, the second heat dissipating layer 80 can be flexibly in contact with the opto-electric conversion portion 6. Therefore, it is possible to suppress the damage to the opto-electric conversion portion 6.

Further, the opto-electric transmission composite module 1 may include the first terminal 27 and the second terminal 28 which are electrically connected to the opto-electric conversion portion 6, and the opto-electric hybrid board 5 may not yet be mounted with the opto-electric conversion portion 6.

Figure 3:
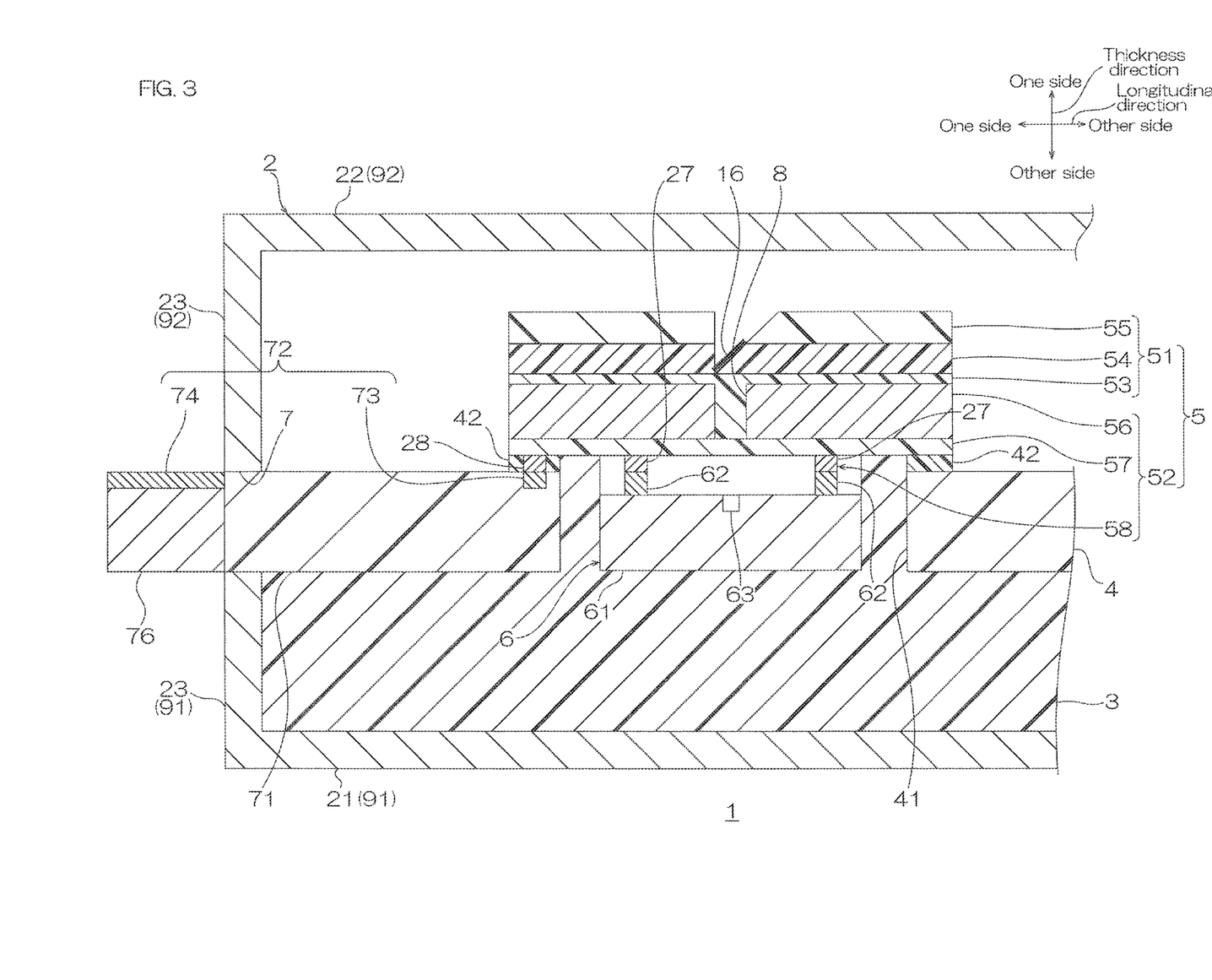
FIG. 3 shows a cross-sectional view of a modified example of the opto-electric transmission composite module shown in FIG. 1.
Figure 4:
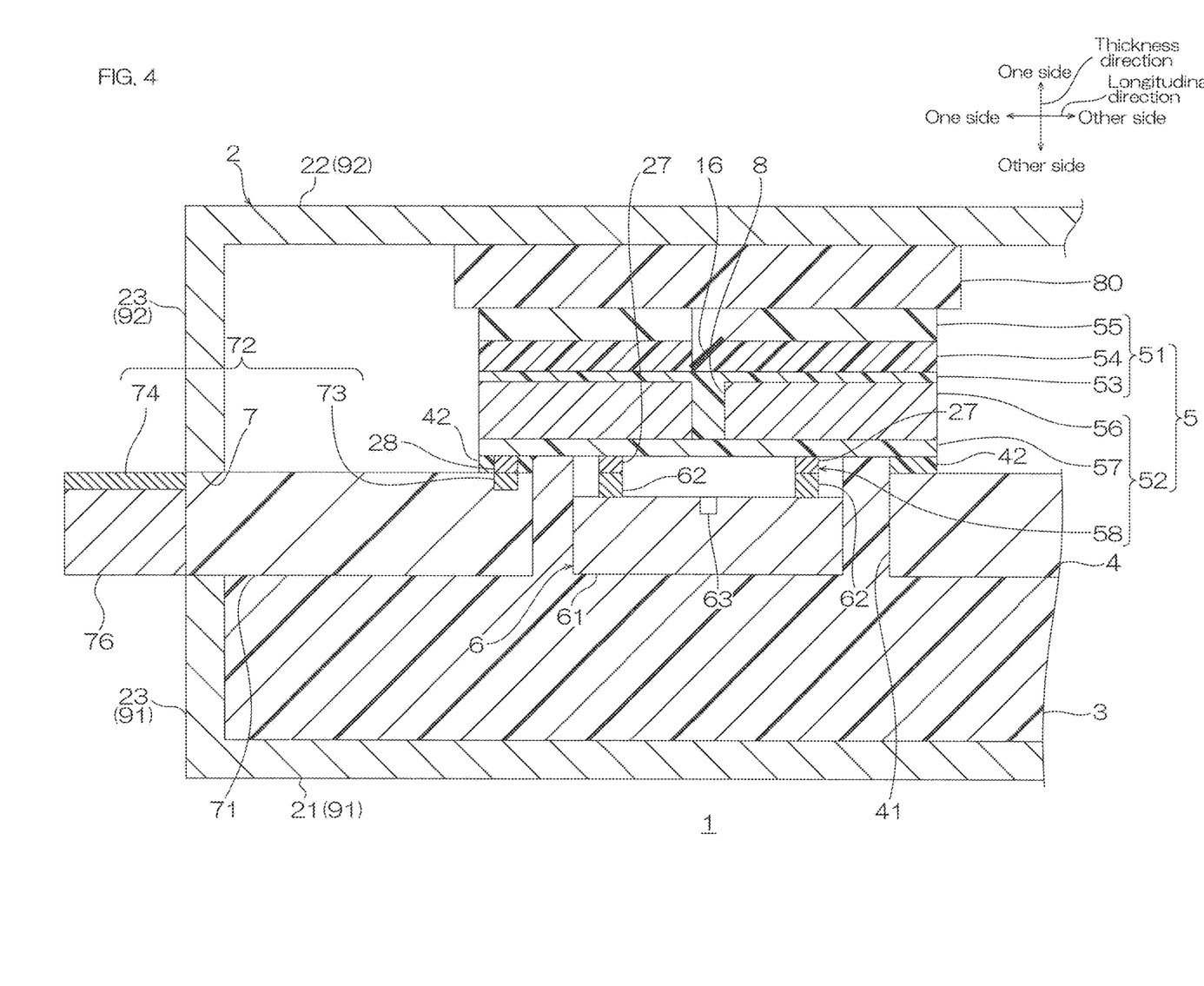
FIG. 4 shows a cross-sectional view of a further modified example of the opto-electric transmission composite module shown in FIG. 3.
Figure 5:
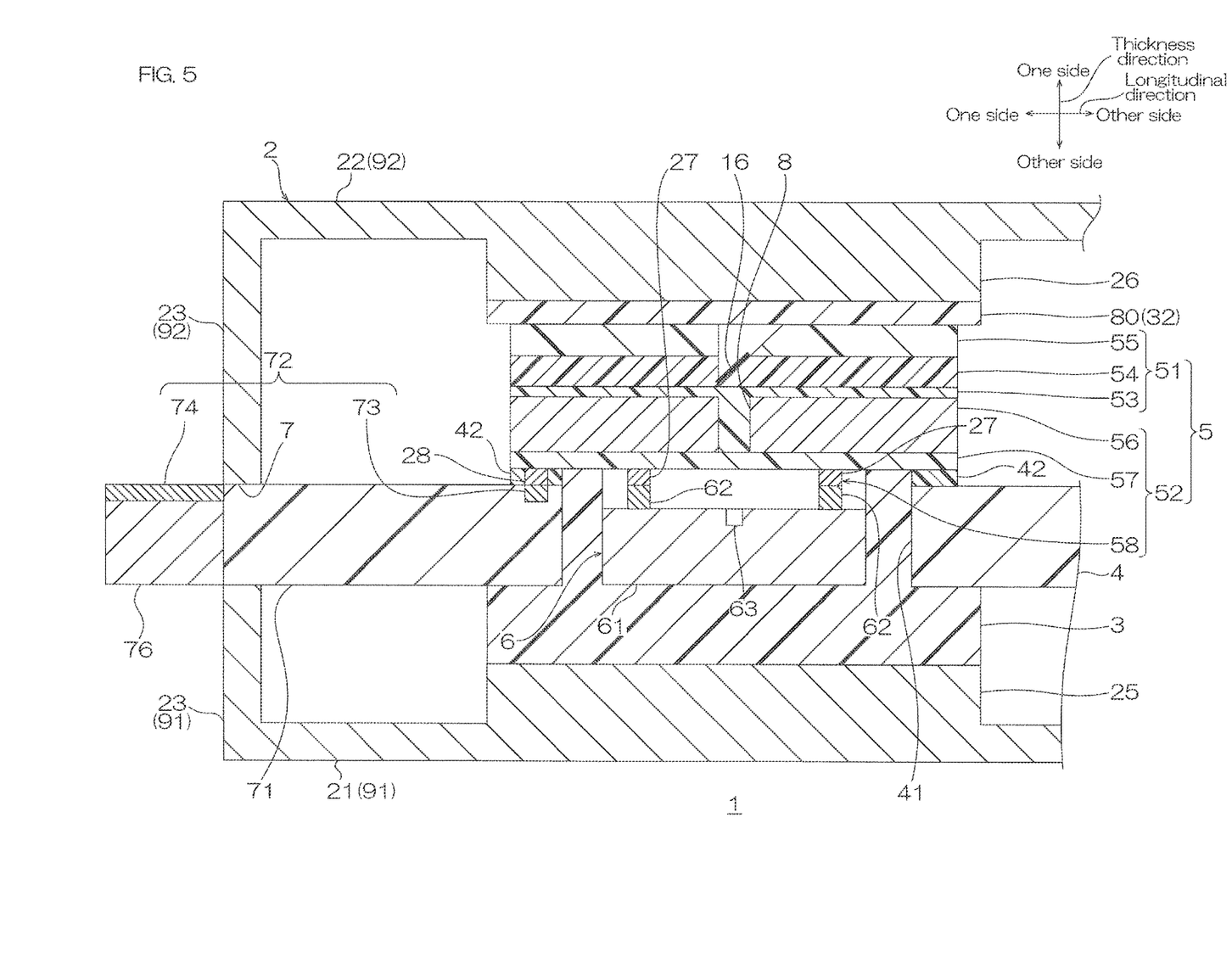
FIG. 5 shows a cross-sectional view of a further modified example of the opto-electric transmission composite module shown in FIG. 4.

As shown in FIGS. 3 to 5, the arrangement of the optical waveguide 51, the electric circuit board 52, and the opto-electric conversion portion 6 in the thickness direction may be reversed.

As shown in FIG. 3, in the opto-electric transmission composite module 1, the optical waveguide 51, the electric circuit board 52, and the opto-electric conversion portion 6 are disposed in order toward the other side in the thickness direction.

The printed wiring board 4 has a through hole 41 penetrating in the thickness direction. The opto-electric conversion portion 6 is disposed in the through hole 41. The third terminal 73 is disposed at one side in the longitudinal direction of the through hole 41 in the vicinity of the through hole 41. Further, the electric circuit board 52 is fixed to one surface in the thickness direction of the opto-electric conversion portion 6 around the through hole 41 via an adhesive 42.

In the modified example of FIG. 3, the heat dissipating layer 3 is in contact with the other surface in the thickness direction and the inner-side surface of the through hole 41 in the printed wiring board 4, the other surface in the thickness direction and an outer peripheral surface of the opto-electric conversion portion 6, and the other surface in the thickness direction of the electric circuit board 52 around the opto-electric conversion portion 6.

In the modified example of FIG. 4, the second heat dissipating layer 80 is disposed between the second wall 22 and the optical waveguide 51. The second heat dissipating layer 80 is in contact with the second wall 22 and the optical waveguide 51

In the modified example of FIG. 5, the first wall 21 has a first protruding portion 25. The second wall 22 has a second protruding portion 26.

The first protruding portion 25 protrudes toward one side in the thickness direction in the first wall 21. The first protruding portion 25 is in contact with the heat dissipating layer 3.

The second protruding portion 26 protrudes toward the other side in the thickness direction in the second wall 22. The second protruding portion 26 is in contact with the second heat dissipating layer 80.

EXAMPLES

Next, the present invention is further described based on Preparation Examples, Examples, and Comparative Example below. The present invention is however not limited by these Preparation Examples, Examples, and Comparative Example. The specific numerical values in mixing ratio (ratio), property value, and parameter used in the following description can be replaced with upper limit values (numerical values defined as "or less" or "below") or lower limit values (numerical values defined as "or more" or "above") of corresponding numerical values in mixing ratio (ratio), property value, and parameter described in the above-described "DESCRIPTION OF EMBODIMENTS".

Preparation Example 1

As a heat dissipating sheet, PK95 manufactured by SHIU LI TECHNOLOGY CO., LTD. was used (heat dissipating sheet A).

Preparation Example 2

A varnish was prepared by blending alumina (DAM-70, manufactured by Denka Company Limited) as a filler, an epoxy resin (jER828, manufactured by Mitsubishi Chemical Corporation) as a resin, and a curing agent (SI-60, SI-S, manufactured by SANSHIN CHEMICAL CO., LTD.) at an appropriate ratio. Next, the varnish was formed into a film having a thickness of about 1 mm with an applicator, and then, heated for 30 minutes with an oven of 80° C., thereby fabricating a heat dissipating sheet B.

Preparation Example 3

A heat dissipating sheet C was fabricated in the same manner as in Preparation Example 2, except that the mixing amount of alumina was reduced so that the thermal conductivity thereof was lower than that of the heat dissipating sheet B of Preparation Example 2.
<Properties of Heat Dissipating Sheet>
The properties of the heat dissipating sheet and the second heat dissipating sheet are described in Table 1.

Examples 1 to 3

Figure 1:
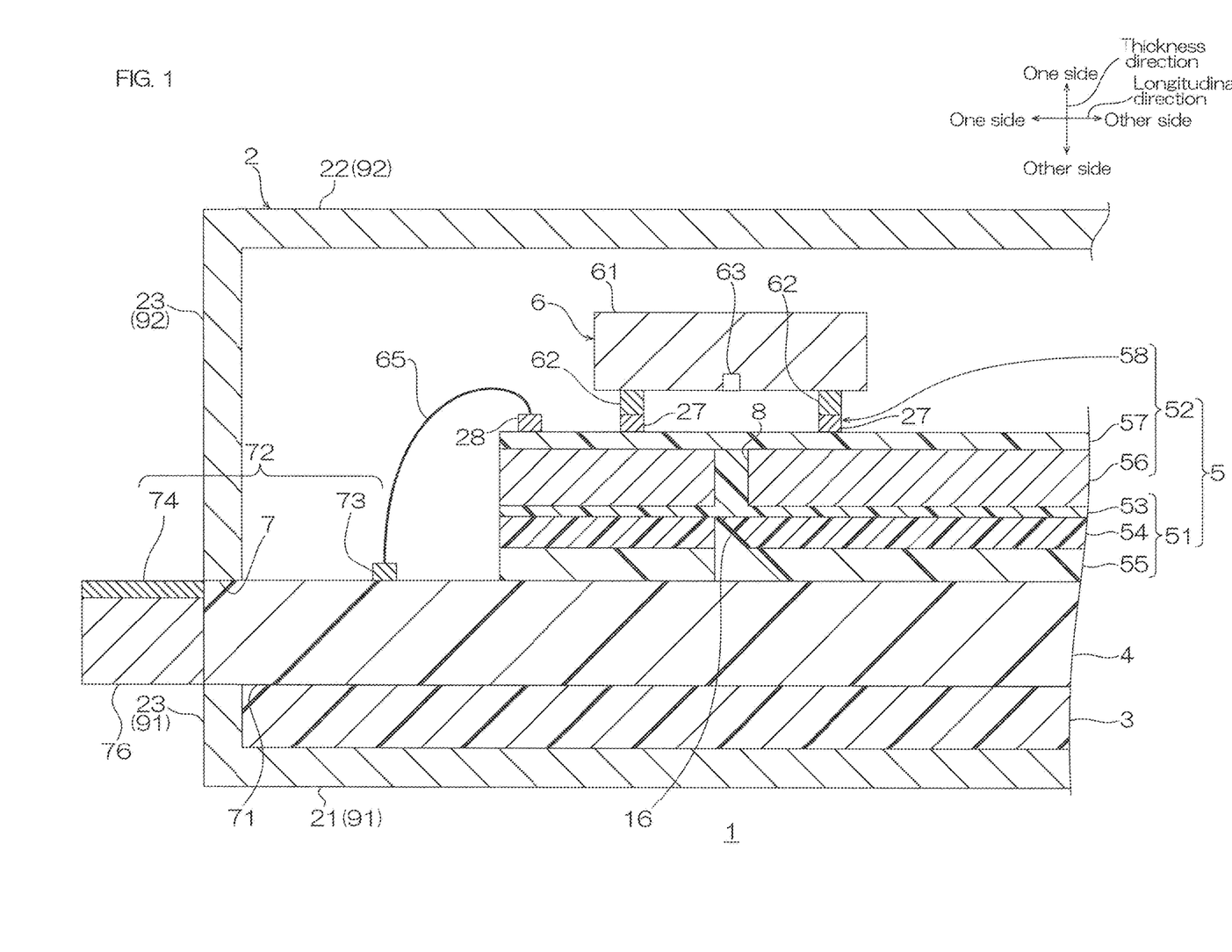
FIG. 1 shows a cross-sectional view of one embodiment of an opto-electric transmission composite module of the present invention.

The opto-electric transmission composite module 1 of one embodiment shown in FIG. 1 was produced.

In Example 1, the heat dissipating sheet A was used for the fabrication of the heat dissipating layer 3.

In Example 2, the heat dissipating sheet B was used for the fabrication of the heat dissipating layer 3.

In Example 3, the heat dissipating sheet C was used for the fabrication of the heat dissipating layer 3.

Examples 4 to 6

The opto-electric transmission composite module 1 of the modified example shown in FIG. 2 was produced. The opto-electric transmission composite module 1 further included the second heat dissipating layer 80.

In Example 4, the two heat dissipating sheets A were used for the fabrication of the heat dissipating layer 3 and the second heat dissipating layer 80.

In Example 5, the two heat dissipating sheets B were used for the fabrication of the heat dissipating layer 3 and the second heat dissipating layer 80.

In Example 6, the two heat dissipating sheets C were used for the fabrication of the heat dissipating layer 3 and the second heat dissipating layer 80.

Comparative Example 1

Figure 6:
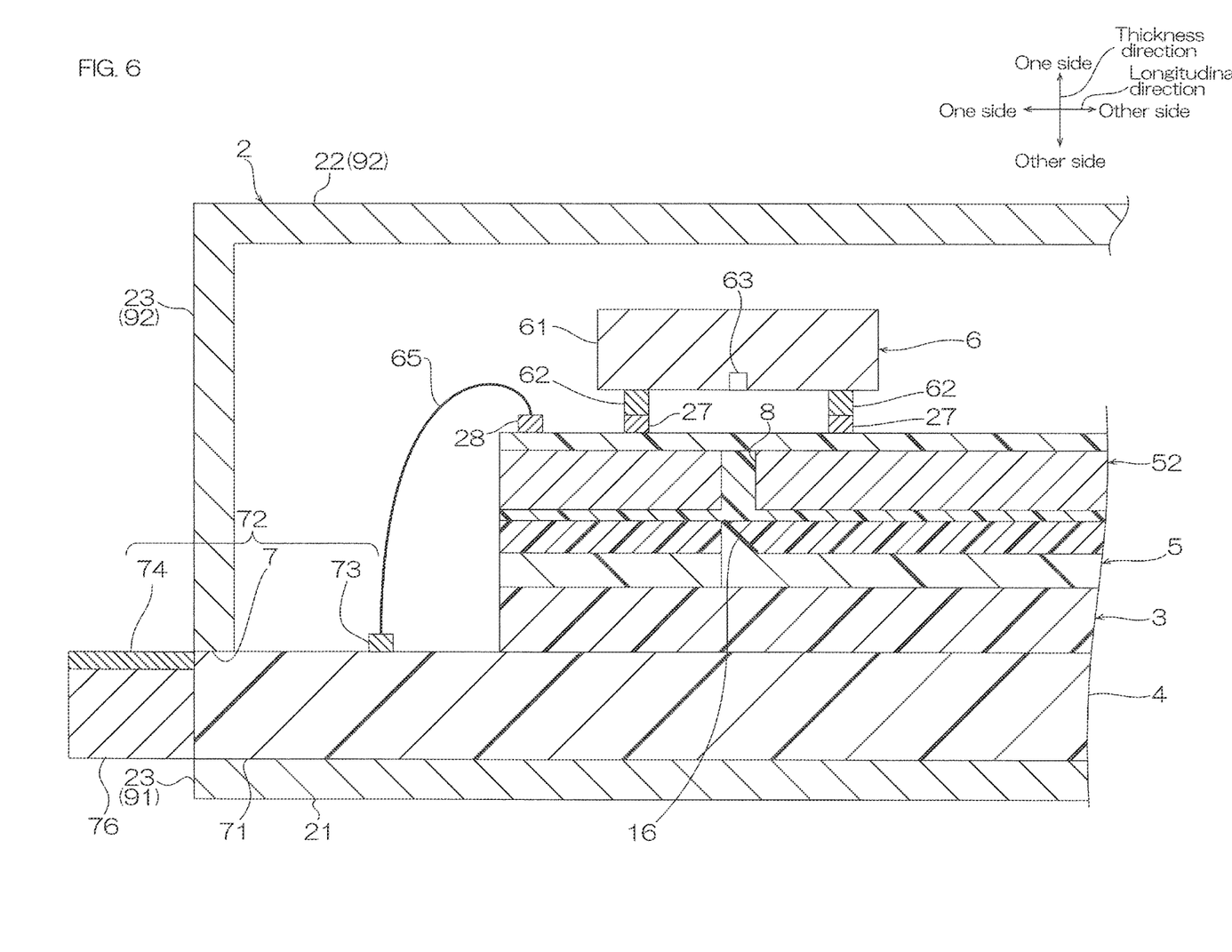
FIG. 6 shows a cross-sectional view of an opto-electric transmission composite module of Comparative Example 1.

The opto-electric transmission composite module 1 shown in FIG. 6 was produced in the same manner as in Example 1, except that the arrangement in the thickness direction of the printed wiring board 4 and the heat dissipating layer 3 was changed.

In the opto-electric transmission composite module 1 of Comparative Example 1, the first wall 21, the printed wiring board 4, the heat dissipating layer 3, the opto-electric hybrid board 5, and the opto-electric conversion portion 6 were disposed in order toward one side in the thickness direction, and the heat dissipating layer 3 was not in contact with the first wall 21.
<Evaluation>
The following items were evaluated.
(1) Heat Dissipation of Opto-Electric Conversion Portion The opto-electric conversion portion 6 was driven to evaluate the heat dissipation properties based on the following criteria.

A temperature of a light emitting element at the time of driving was calculated by simulation, and the heat dissipation properties were evaluated. In the simulation, a model in which the opto-electric conversion portion 6 including a light emitting element, a light emitting driving element, a light receiving element, and a light receiving driving element were provided was used under the environment of cooling at a wind speed of 0.1 m/s.

Excellent: temperature of the light emitting element was below 50° C.
Good: temperature of the light emitting element was 50° C. or more and below 55° C.
Fair: temperature of the light emitting element was 55° C. or more and below 60° C.
Bad: temperature of the light emitting element was 60° C. or more.

(2) Damage to Opto-Electric Conversion Portion

The opto-electric conversion portion 6 was observed, and the damage was evaluated based on the following criteria.

Excellent: damage to the opto-electric conversion portion 6 was not observed at all.
Good: damage to the opto-electric conversion portion 6 was slightly observed.

[Table 1]

TABLE 1

| | | Ex. 1 | Ex. 2 | Ex. 3 | Ex. 4 | Ex. 5 | Ex. 6 | Comparative Ex. 1 |
|---|---|---|---|---|---|---|---|---|
| Configuration •Properties | Embodiment | One Embodiment (FIG. 1) | One Embodiment (FIG. 1) | One Embodiment (FIG. 1) | Modified Example (FIG. 2) | Modified Example (FIG. 2) | Modified Example (FIG. 2) | Corresponding to Patent Document 1 (FIG. 3) |
| | Heat Dissipating Sheet | A | B | C | A | B | C | A*[1] |
| | Second Heat Dissipating Sheet | — | — | — | A | B | C | — |
| | Thermal Conductivity of Heat Dissipating Sheet [W/m · K] | 12 | 12 | 1.5 | 12 | 12 | 1.5 | 12 |
| | Asker C Hardness of Heat Dissipating Sheet | 40 | 70 | 60 | 40 | 70 | 60 | 40 |
| Evaluation | Heat Dissipation of Opto-Electric Conversion Portion | Good | Good | Fair | Excellent | Excellent | Good | Bad |
| | Damage to Opto-Electric Conversion Portion | — | — | — | Excellent | Good | Good | — |

*[1]Not in contact with first wall

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

An opto-electric transmission composite module of the present invention is used for signal transmission.

1 Opto-electric transmission composite module
2 Casing
3 Heat dissipating layer
4 Printed wiring board
5 Opto-electric hybrid board
6 Opto-electric conversion portion
21 First wall
22 Second wall
51 Optical waveguide
52 Electric circuit board
80 Second heat dissipating layer

The invention claimed is:

1. An opto-electric transmission composite module comprising:
an opto-electric hybrid board configured to be optically and electrically connected to an opto-electric conversion portion and including an optical waveguide and an electric circuit board in order toward one side in a thickness direction;
a printed wiring board electrically connected to the electric circuit board;
a heat dissipating member having an Asker C hardness at 23° C. of 75 or less; and
a casing made of metal, the casing accommodating the opto-electric hybrid board, a portion of the printed wiring board, and the heat dissipating member, the casing including a first wall and a side wall connecting the first wall, wherein:
the first wall, the heat dissipating member, the printed wiring board, and the opto-electric hybrid board are disposed in order toward the one side in the thickness direction;
the heat dissipating member is in physical contact with the first wall and a surface of the printed wiring board on another side in the thickness direction of the printed wiring board; and
the printed wiring board has a Shore A hardness of 80 or more to provide a rigid coupling between the printed wiring board and the first wall through the heat dissipating member.

2. The opto-electric transmission composite module according to claim 1, wherein
a thermal conductivity in the thickness direction of the heat dissipating member is 5 W/m· K or more.

3. The opto-electric transmission composite module according to claim 1 further comprising:
the opto-electric conversion portion optically and electrically connected to the opto-electric hybrid board, and
a second heat dissipating member in contact with the opto-electric conversion portion, wherein the casing further includes a second wall disposed at the opposite side to the first wall in the thickness direction with respect to the opto-electric conversion portion, and the second heat dissipating member is in contact with the second wall.

4. The opto-electric transmission composite module according to claim 3, wherein an Asker C hardness of the second heat dissipating member is 55 or less.

* * * * *